(12) United States Patent
Afzali-Ardakani et al.

(10) Patent No.: US 10,243,156 B2
(45) Date of Patent: Mar. 26, 2019

(54) PLACEMENT OF CARBON NANOTUBE GUIDED BY DSA PATTERNING

(71) Applicant: International Business Machines Corporation, Armonk, NY (US)

(72) Inventors: Ali Afzali-Ardakani, Ossining, NY (US); Sarunya Bangsaruntip, Mount Kisco, NY (US); Shu-Jen Han, Cortlandt Manor, NY (US); HsinYu Tsai, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/461,175

(22) Filed: Mar. 16, 2017

(65) Prior Publication Data

US 2018/0269412 A1 Sep. 20, 2018

(51) Int. Cl.
*H01L 29/04* (2006.01)
*H01L 51/05* (2006.01)
*H01L 51/00* (2006.01)

(52) U.S. Cl.
CPC ...... *H01L 51/0558* (2013.01); *H01L 51/0003* (2013.01); *H01L 51/0012* (2013.01);
(Continued)

(58) Field of Classification Search
CPC ............. H01L 51/0048; H01L 51/0558; H01L 51/0003; H01L 51/0012; H01L 51/0049;
(Continued)

(56) References Cited

U.S. PATENT DOCUMENTS 7,311,776 B2 12/2007 Lin et al.
7,563,500 B2 7/2009 Busnaina et al.
(Continued)

FOREIGN PATENT DOCUMENTS

WO WO2009126876 A1 10/2009
WO WO-2015187390 A2 * 5/2015 ......... H01L 31/0256

OTHER PUBLICATIONS

Han et al., "DNA-linker-induced surface assembly of ultra dense parallel single walled carbon nanotube arrays," Nano letters, vol. 12, issue 3, pp. 1129-1135 (Feb. 2012).
(Continued)

*Primary Examiner* — Brook Kebede
(74) *Attorney, Agent, or Firm* — L. Jeffrey Kelly; Michael J. Chang, LLC

(57) ABSTRACT

In one aspect, a method for placing carbon nanotubes on a dielectric includes: using DSA of a block copolymer to create a pattern in the placement guide layer on the dielectric which includes multiple trenches in the placement guide layer, wherein there is a first charge on sidewall and top surfaces of the trenches and a second charge on bottom surfaces of the trenches, and wherein the first charge is different from the second charge; and depositing a carbon nanotube solution onto the dielectric, wherein self-assembly of the deposited carbon nanotubes within the trenches occurs based on i) attractive forces between the first charge on the surfaces of the carbon nanotubes and the second charge on the bottom surfaces of the trenches and ii) repulsive forces between the first charge on the surfaces of the carbon nanotubes and the first charge on sidewall and top surfaces of the trenches.

7 Claims, 10 Drawing Sheets

(52) U.S. Cl.
CPC ...... *H01L 51/0049* (2013.01); *H01L 51/0093* (2013.01); *H01L 51/0545* (2013.01); *H01L 2251/303* (2013.01)

(58) Field of Classification Search
CPC ............ H01L 51/0093; H01L 51/0545; H01L 29/775; H01L 2251/303; B82Y 10/00
USPC ............ 257/9.29, E23.025, E51.04; 977/742
See application file for complete search history.

(56) References Cited

U.S. PATENT DOCUMENTS

| | | | |
|---|---|---|---|
| 7,785,415 B2 | 8/2010 | Lin et al. | |
| 7,790,600 B2 | 9/2010 | Jacobs et al. | |
| 7,795,677 B2 | 9/2010 | Bangsaruntip et al. | |
| 8,153,470 B2 | 4/2012 | Lieber et al. | |
| 8,178,402 B2 | 5/2012 | Zhang | |
| 8,367,035 B2 | 2/2013 | Rogers et al. | |
| 8,367,462 B2 | 2/2013 | Wang et al. | |
| 8,450,202 B1 | 5/2013 | Humfeld | |
| 8,471,298 B2 | 6/2013 | Lieber et al. | |
| 9,246,112 B2* | 1/2016 | Franklin | H01L 51/0554 |
| 2006/0021881 A1* | 2/2006 | Soundarrajan | B82Y 10/00 205/777.5 |
| 2007/0200477 A1 | 8/2007 | Tuominen et al. | |
| 2010/0090293 A1* | 4/2010 | Zhang | B82Y 10/00 257/411 |
| 2012/0028820 A1* | 2/2012 | Rhodes | B82Y 15/00 506/9 |
| 2013/0078576 A1 | 3/2013 | Wu et al. | |
| 2014/0363643 A1 | 12/2014 | Afzali-Ardakani et al. | |
| 2017/0190573 A1* | 7/2017 | Shen | B82B 3/0047 |

OTHER PUBLICATIONS

Wu et al., "Self-Assembly of Semiconducting Single-Walled Carbon Nanotubes into Dense, Aligned Rafts," Small, vol. 9, Issue 24, pp. 4142-4148 (Dec. 2013).

Park et al., "High-density integration of carbon nanotubes via chemical self-assembly," Nature Nanotechnology 7, 787-791 (Oct. 2012).

Marencic, "Controlling order in block copolymer thin films for nanopatterning applications," Annu. Rev. Chem. Biomol. Eng. 1:277-97 (Jun. 2010) (20 total pages).

Tu et al., "DNA sequence motifs for structure-specific recognition and separation of carbon nanotubes" Nature vol. 460, pp. 250-253 (Jul. 9, 2009).

Kowalewska et al., "Application of Positively Charged Carbon Nanotubes to Layer-by-Layer Assemblies of Dehydrogenase Enzymes for Molecular Bioelectronic Devices," Abstract #2440, 224th ECS Meeting (Oct./Nov. 2013) (1 page).

* cited by examiner

PLACEMENT OF CARBON NANOTUBE GUIDED BY DSA PATTERNING

FIELD OF THE INVENTION

The present invention relates to carbon nanotube technology and more particularly, to the placement of carbon nanotubes guided by directed self-assembly patterning.

BACKGROUND OF THE INVENTION

High performance carbon nanotube transistors have been demonstrated, outperforming the silicon (Si) counterpart. Carbon nanotubes are therefore one of the leading candidates for a future, post-Si, high performance logic technology.

However, for the carbon nanotube devices to be competitive with their Si counterparts, the carbon nanotubes need to be placed at a sufficiently high density. Several approaches exist for carbon nanotube placement, but none is able to deliver carbon nanotube density in the required range in large scale. For instance, some of the approaches provide for a high carbon nanotube density, but there is no pathway to scale up the process. See, for example, Han et al., "DNA-linker-induced surface assembly of ultra dense parallel single walled carbon nanotube arrays," Nano letters, vol. 12, issue 3, pgs. 1129-1135 (February 2012); and Wu et al., "Self-Assembly of Semiconducting Single-Walled Carbon Nanotubes into Dense, Aligned Rafts," Small, Vol. 9, Issue 24, pgs. 4142-4148 (December 2013). Further, with these techniques the carbon nanotubes are not aligned. Other approaches—such as chemical vapor deposition (CVD) on crystal steps of annealed quartz or sapphire—achieve good alignment of the carbon nanotubes, however the density is low. Further, these approaches result in mixed carbon nanotube types (semiconducting and metallic). Repeating the process to increase density only serves to increase the amount of undesirable metallic carbon nanotubes present.

The controlled placement and arrangement of carbon nanotubes on a substrate was demonstrated, for example, in Park et al., "High-density integration of carbon nanotubes via chemical self-assembly," Nature Nanotechnology 7, 787-791 (October 2012) (hereinafter "Park"); and U.S. Patent Application Publication Number 2014/0363643 by Afzali-ardakani et al., entitled "Surface-Selective Carbon Nanotube Deposition Via Polymer-Mediated Assembly." These approaches, however, have a limited resolution which is a roadblock to scalability.

Thus, scalable techniques for producing high-density, well-aligned, semiconducting carbon nanotubes would be desirable.

SUMMARY OF THE INVENTION

The present invention provides techniques for the placement of carbon nanotubes guided by directed self-assembly (DSA) patterning. In one aspect of the invention, a method for placing carbon nanotubes on a dielectric is provided. The method includes the steps of: forming a placement guide layer on the dielectric; using DSA of a block copolymer to create a pattern in the placement guide layer, wherein the pattern includes multiple trenches in the placement guide layer, wherein there is a first charge on sidewall and top surfaces of the trenches and a second charge on bottom surfaces of the trenches, and wherein the first charge is different from the second charge; and depositing a solution containing the carbon nanotubes onto the dielectric, wherein the carbon nanotubes are functionalized to have the first charge on surfaces thereof, and wherein self-assembly of the deposited carbon nanotubes within the trenches occurs based on i) attractive forces between the first charge on the surfaces of the carbon nanotubes and the second charge on the bottom surfaces of the trenches and ii) repulsive forces between the first charge on the surfaces of the carbon nanotubes and the first charge on sidewall and top surfaces of the trenches.

In another aspect of the invention, a method of forming a carbon nanotube-based field effect transistor (FET) device is provided. The method includes the steps of: providing a semiconductor substrate; disposing a dielectric on the semiconductor substrate; forming a placement guide layer on the dielectric; using DSA of a block copolymer to create a pattern in the placement guide layer, wherein the pattern includes multiple trenches in the placement guide layer, wherein there is a first charge on sidewall and top surfaces of the trenches and a second charge on bottom surfaces of the trenches, and wherein the first charge is different from the second charge; depositing a solution containing carbon nanotubes onto the substrate, wherein the carbon nanotubes are functionalized to have the first charge on surfaces thereof, and wherein self-assembly of the deposited carbon nanotubes within the trenches occurs based on i) attractive forces between the first charge on the surfaces of the carbon nanotubes and the second charge on the bottom surfaces of the trenches and ii) repulsive forces between the first charge on the surfaces of the carbon nanotubes and the first charge on sidewall and top surfaces of the trenches; removing the placement guide layer; and forming metal source and drain contacts to the carbon nanotubes.

In yet another aspect of the invention, a carbon nanotube-based FET device is provided. The carbon nanotube-based FET device includes a semiconductor substrate; a dielectric disposed on the semiconductor substrate; carbon nanotubes placed parallel to one another on the dielectric, wherein a pitch of the carbon nanotubes is less than or equal to about 28 nanometers; and metal source and drain contacts on the carbon nanotubes.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for carbon nanotube placement guided by directed self-assembly (or DSA) of a block copolymer. DSA of a block copolymer provides an effective solution for the large-scale, sub-lithographic (tight pitch) patterning resolution which will be applied herein to the placement of carbon nanotubes for achieving the targeted density required. Thus, the present techniques provide an effective, viable solution for dense, well-aligned carbon nanotube placement in accordance with scaled technologies. In fact, it has been found herein that as the patterned features become smaller, the alignment (orientation) of the carbon nanotubes is in fact more precise.

DSA is a process by which a guiding structure (chemical or topological) is used to guide or direct the phase formation into orientations which can be used in the semiconductor lithographic process. Two types of guiding structures have been investigated in the art and have lead to two types of processes—grapho-epitaxy and chemo-epitaxy—either of which can be used in accordance with the present techniques. DSA involves the self-separation (assembly) to form domains. Polymer size determines the domain size. DSA can be used to form spheres, cylinders, or sheets depending on the composition. See, for example, Marencic, "Controlling order in block copolymer thin films for nanopatterning applications," Annu. Rev. Chem. Biomol. Eng. 1:277-97 (June 2010).

Figure 1:
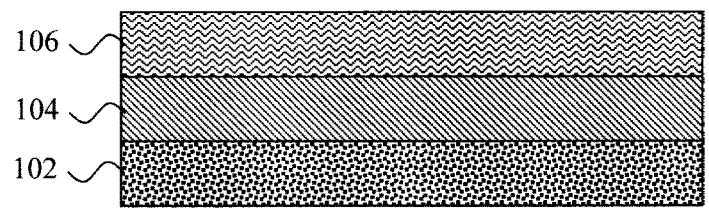
FIG. 1 is a cross-sectional diagram illustrating a dielectric material having been deposited onto a substrate, and a (carbon nanotube) placement guide layer (e.g., poly-silicon (poly-Si)) having been deposited onto the dielectric material according to an embodiment of the present invention.
Figure 2:
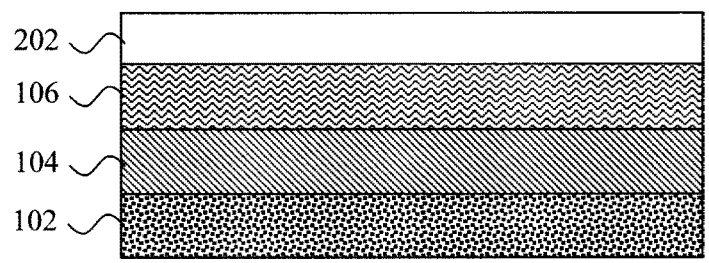
FIG. 2 is a cross-sectional diagram illustrating a neutral layer having been formed on the placement guide layer according to an embodiment of the present invention.

FIGS. 1-11 provide an overview of one exemplary embodiment of the present techniques for placing carbon nanotubes guided by grapho-epitaxy DSA patterning. As shown in FIG. 1, the process begins with the deposition of a dielectric material 104 on a substrate 102. According to an exemplary embodiment, substrate 102 is a semiconductor substrate such as a bulk semiconductor wafer. Suitable semiconductor materials for substrate 102 include, but are not limited to, silicon (Si), germanium (Ge), silicon germanium (SiGe), etc. According to an exemplary embodiment, the dielectric material 104 is an oxide material such as hafnium oxide ($HfO_2$) or aluminum oxide ($AlO_2$). By way of example only, the dielectric material 104 can be blanket deposited onto the substrate 102 using a deposition process such as atomic layer deposition (ALD) or chemical vapor deposition (CVD) to a thickness, for example, of from about 2 nanometers (nm) to about 50 nm, and ranges therebetween.

Next, a (carbon nanotube) placement guide layer 106 is then blanket deposited onto the dielectric material 104 (i.e., onto a side of the dielectric material 104 opposite the substrate 102). As its name indicates, the placement guide layer (which will be subsequently patterned using a DSA block copolymer mask) will guide the placement of the carbon nanotubes on the dielectric material 104. According to an exemplary embodiment, the placement guide layer 106 is formed from poly-silicon (poly-Si). By way of example only, poly-Si as the placement guide layer can be blanket deposited onto the dielectric material 104 using CVD to a thickness of from about 1 nm to about 10 nm, and ranges therebetween. In another exemplary embodiment, silicon oxide ($SiO_2$) can also be used instead of poly-Si.

A neutral layer 202 is then formed on the placement guide layer 106. See FIG. 2. Without a neutral layer, interactions between the block copolymer and the underlying materials can affect the self-assembly process. A suitable neutral layer has no affinity for either of the block copolymers, and thus the proper orientation and placement of the block copolymers can be achieved. See, for example, U.S. Patent Application Publication Number 2013/0078576 A1 by Wu et al., entitled "Compositions of neutral layer for directed self assembly block copolymers and processes thereof" (hereinafter "U.S. Patent Application Publication Number 2013/0078576 A1"), the contents of which are incorporated by reference as if fully set forth herein. Suitable neutral layer compositions are provided in U.S. Patent Application Publication Number 2013/0078576 A1. By way of example only, a commercially available neutral layer material such as NLD-089 (available from EMD Performance Materials a subsidiary of Merck KGaA, Darmstadt, Germany) is coated on the placement guide layer 106 and then baked at a temperature of from about 200 degrees Celsius (° C.) to about 250° C., and ranges therebetween, for a duration of from about 1 minute to about 5 minutes, and ranges therebetween. A rinse (e.g., with propylene glycol monomethyl ether acetate (PGMEA)) can be performed, followed by a bake for the same temperature/duration.

Figure 3:
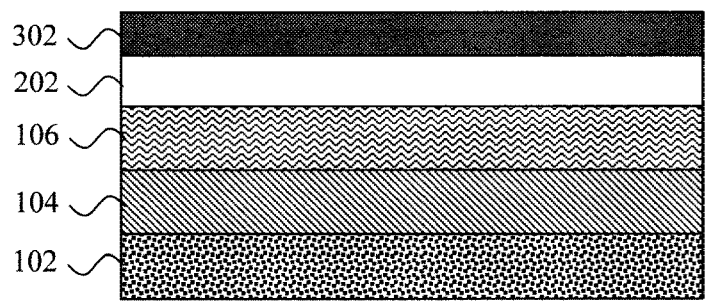
FIG. 3 is a cross-sectional diagram illustrating a directed self-assembly (DSA) template resist material having been deposited on the neutral layer according to an embodiment of the present invention.
Figure 4:
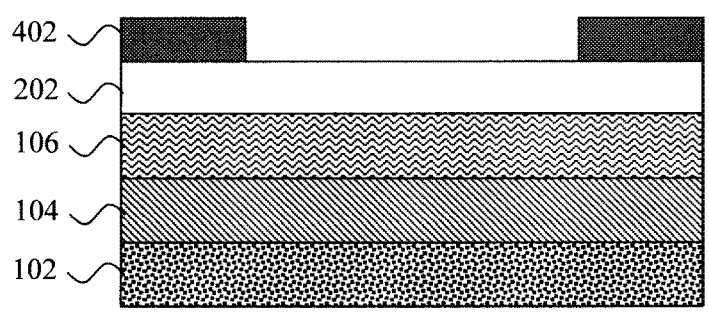
FIG. 4 is a cross-sectional diagram illustrating the DSA template resist material having been patterned to form a DSA template according to an embodiment of the present invention.

As shown in FIGS. 3 and 4, a DSA template is next formed on the neutral layer 202 (i.e., on a side of the neutral layer 202 opposite the placement guide layer 106). Namely, as shown in FIG. 3 a suitable DSA template resist material 302 is first deposited on the neutral layer 202. Suitable DSA template resist materials include, but are not limited to, electron-beam (e-beam) lithography, hydrogen silsesquioxane (HSQ), or 193$i$ resist materials. By way of example only, when HSQ is used to form the DSA template a layer of HSQ can be cast onto the neutral layer, and then directly patterned (e.g., using e-beam) to cross-link the HSQ. The uncross-linked portions of the HSQ (e.g., those portions not exposed during the e-beam write) can then be removed using a standard developer revealing the cross-linked/pattern in the HSQ resist. A post apply bake (e.g., at from about 100° C. to about 300° C., and ranges therebetween) can then be used to harden the HSQ. As shown in FIG. 4, the result is a DSA template 402 having been formed on the neutral layer 202 (i.e., on a side of the neutral layer 202 opposite the placement guide layer 106).

The DSA template serves to align the assembly of the DSA block copolymer into linear segments (see for example FIG. 14—described below) which is desirable for carbon nanotube transistor applications. Thus when the DSA block copolymer is used to pattern trenches in the underlying substrate and carbon nanotubes are deposited in the trenches, the carbon nanotubes will be linear/parallel to one another on the surface of the substrate. Without a DSA template, the DSA block copolymer will arrange into fingerprint-like patterns on the substrate (see for example regions outside of the DSA template in FIG. 14).

Figure 5:
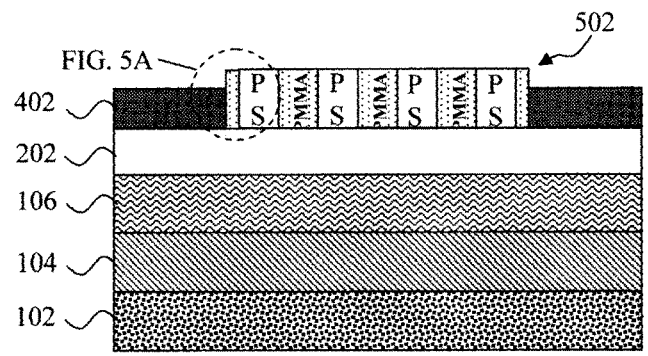
FIG. 5 is a cross-sectional diagram illustrating a DSA block copolymer (e.g., poly(styrene-block-methyl methacrylate) (PS-b-PMMA)) having been deposited onto the neutral layer and the DSA template according to an embodiment of the present invention.

Next, as shown in FIG. 5, a suitable DSA block copolymer 502 such as poly(styrene-block-methyl methacrylate) (PS-b-PMMA)—see FIG. 5 (e.g., AZ PME120 available from EMD Performance Materials a subsidiary of Merck KGaA, Darmstadt, Germany) is deposited onto the neutral layer 202 within the DSA template 402. Self-assembly of the block copolymer is facilitated by a thermal treatment, such as a bake at from about 200° C. to about 300° C., and ranges therebetween, for a duration of from about 5 minutes to about 10 minutes, and ranges therebetween. The DSA template 402 provides a guide for self-assembly of the block copolymer.

Figure 5A:
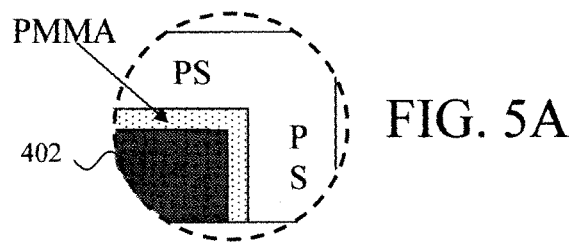
FIG. 5A is a an expanded view over the DSA template from FIG. 5 which illustrates how the DSA block copolymer might form over the DSA template according to an embodiment of the present invention.

It is notable that the DSA block copolymer 502 will likely form over the DSA template 402. See, for example, the expanded view over the DSA template 402 shown in FIG. 5A. In that case, the PS will cover the PMMA block adjacent to the DSA template 402 and protect this PMMA block from etching. This is why even though the PMMA block adjacent to the DSA template 402 is shown present following patterning of the DSA block copolymer 502 in FIG. 5, this PMMA block is not pattern-transferred in the subsequent steps.

Figure 6:
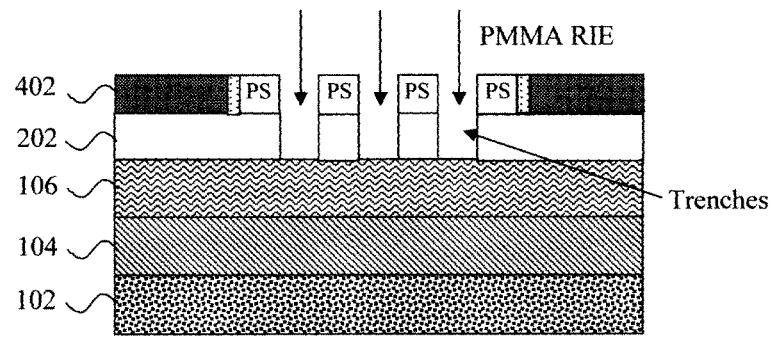
FIG. 6 is a cross-sectional diagram illustrating the DSA block copolymer having been patterned according to an embodiment of the present invention.

A selective etching process can then be used to pattern the DSA block copolymer 502. For example, as shown in FIG. 6, with a PS-b-PMMA block copolymer 502, a PMMA reactive ion etch (RIE) can be used to remove the PMMA blocks from the copolymer 502, forming trenches in the copolymer 502. From FIG. 6 it can be seen that such a PMMA selective RIE will also etch the underlying neutral layer 202.

Figure 7:
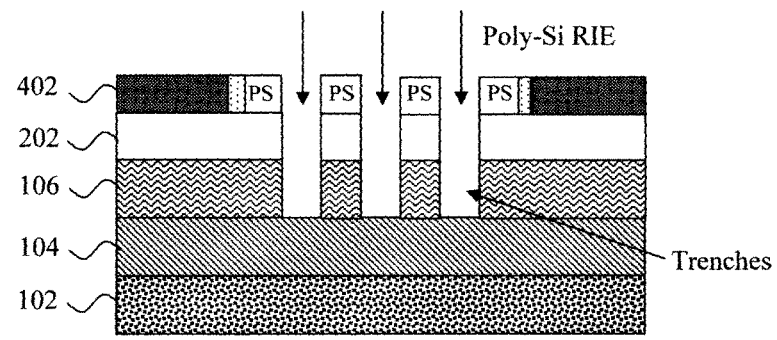
FIG. 7 is a cross-sectional diagram illustrating the pattern from the DSA block copolymer having been transferred to the placement guide layer according to an embodiment of the present invention.
Figure 8:
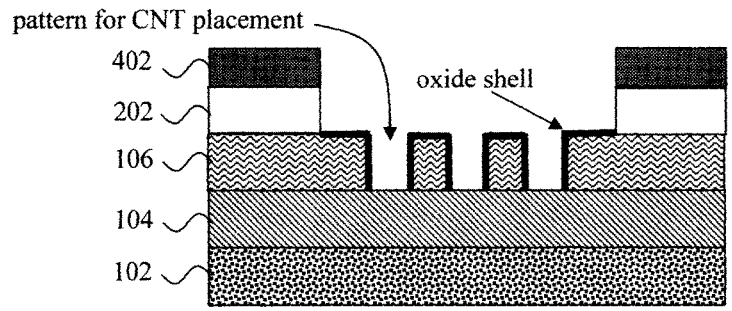
FIG. 8 is a cross-sectional diagram illustrating the remaining PS blocks and the neutral layer below having been removed and an oxide shell having been formed on the placement guide layer according to an embodiment of the present invention.

The pattern from the DSA block copolymer 502 can then be transferred to the placement guide layer 106 using, e.g., a poly-Si RIE. See FIG. 7. As shown in FIG. 7, the patterned placement guide layer 106 now contains a plurality of trenches. In the example depicted in the figures, the dielectric 104 acts as an etch stop for the poly-Si RIE. An oxygen ($O_2$) plasma etch can then be used to remove the remaining PS blocks, and oxidize the placement guide layer 106. See FIG. 8. As provided above, it is also possible to directly use $SiO_2$ as the placement guide layer 106, so that the guide layer is guaranteed to have oxidized surfaces (i.e., surface chemistry of the placement guide layer 106 and dielectric 104 is important to the carbon nanotube placement process, so the combination of material composition, etch recipe selection, and placement process need to be optimized together). As shown in FIG. 8, an $O_2$ plasma etch will also remove all but those portions of the neutral layer 202 covered by the DSA template 402. The oxidation forms an oxide shell on the placement guide layer 106. This oxide shell is a notable aspect of the present carbon nanotube placement techniques. Namely, as will be described in detail below, functionalization of the carbon nanotubes will give the carbon nanotubes a negative surface charge. The oxide shell will also provide a negative surface charge on the placement guide layer 106. The underlying dielectric 104 will have a positive charge. Accordingly, repulsive forces based on the like (negative) charge of the carbon nanotubes and the placement guide layer 106, and attractive forces based on the opposite (negative/positive) charge of the carbon nanotubes and the dielectric 104, respectively, will serve to direct the carbon nanotubes to the surface of the dielectric 104 within the placement guide layer pattern.

Figure 9:
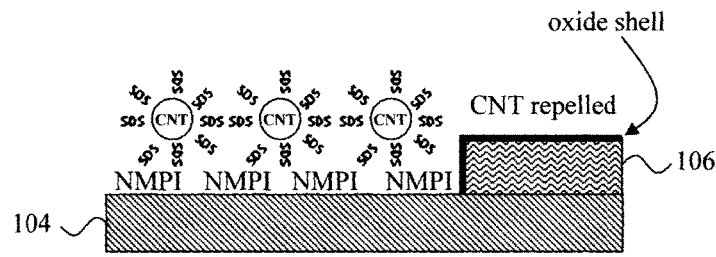
FIG. 9 is a cross-sectional diagram illustrating how the negative surface charge (based, e.g., on sodium dodecyl sulphate (SDS) functionalization of the carbon nanotubes) attracts the carbon nanotubes to the positively charged (based, e.g., on 4-(N-hydroxycarboxamido)-1-mehtylpyridinium iodide (NMPI) functionalization of the dielectric) surface of the dielectric, and repels the carbon nanotubes from the negatively charged placement guide layer (due to the oxide shell) according to an embodiment of the present invention.

As highlighted above, the surface of the dielectric 104 preferably has a positive charge. According to one exemplary embodiment, functionalization is used to create this positive surface charge on the dielectric 104. For example, a surface monolayer of 4-(N-hydroxycarboxamido)-1-mehtylpyridinium iodide (NMPI) is formed on the exposed surfaces of the dielectric 104. The process for forming this NMPI monolayer on a $HfO_2$ surface is described in detail in Park, the contents of which are incorporated by reference as if fully set forth herein. A negative surface charge on the carbon nanotubes may be created using non-covalent functionalization of the carbon nanotubes with a negatively charged sodium dodecyl sulphate (SDS) surfactant wrapped around the carbon nanotubes. See, for example, Park. This particular surface functionalization chemistry is shown illustrated in FIG. 9. As shown in FIG. 9, the negative surface charge (based on the SDS functionalization of the carbon nanotubes (CNTs)) attracts the carbon nanotubes to the positively charged (based on the NMPI functionalization of the dielectric 104) surface of the dielectric 104; and repels the carbon nanotubes from the negatively charged placement guide layer 106 (due to the oxide shell). The configuration shown in FIG. 9, however, is merely an example. Other exemplary embodiments are presented herein, for example, where surface functionalization of the dielectric 104 is optional, since the dielectric materials such as $HfO_2$ contemplated herein already have a positive charge; and/or where deoxyribonucleic acid (DNA)-solubilized (rather than SDS-solubilized) carbon nanotubes are employed.

Figure 10:
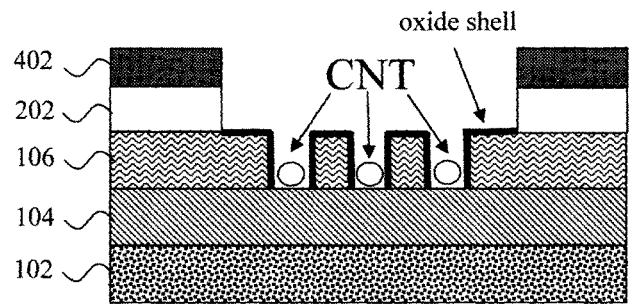
FIG. 10 is a cross-sectional diagram illustrating carbon nanotubes having been deposited onto the structure according to an embodiment of the present invention.

Next, as shown in FIG. 10, carbon nanotubes (CNTs) are deposited onto the structure. Based on the above-described charge arrangement between the carbon nanotubes, the dielectric 104, and the placement guide layer 106, the carbon nanotubes are repelled by the (negatively charged) placement guide layer 106 and attracted to the (positively charged) dielectric 104. As shown in FIG. 10, as a result, the carbon nanotubes self-arrange within the patterned placement guide layer 106. Thus, the patterned placement guide layer 106 acts as a barrier for the carbon nanotube placement.

According to one exemplary embodiment, the carbon nanotubes are prepared as described in Park by first isolating the semiconducting carbon nanotubes from a purified solution of SDS-solubilized metallic and semiconducting single-walled carbon nanotubes. As described in Park, isolation of the semiconducting carbon nanotubes can be achieved using column chromatography. However, other isolation techniques are known in the art, and may be similarly implemented herein. The isolated semiconducting single-walled carbon nanotube solution can then be cast onto the structure, and will self-assemble based on the above-described poly-Si barrier.

The placement guide layer 106, neutral layer 202, and DSA template 402 can then be removed, leaving the self-assembled carbon nanotubes on the surface of the dielectric 104. See FIG. 11. According to an exemplary embodiment, the placement guide layer 106 can be removed using a dry etching process or other suitable selective etching process (such as xenon difluoride ($XeF_2$) vapor phase etching for silicon or hydro fluoride (HF) vapor phase etching for silicon oxide). In the case where the DSA template 402 is HSQ and placement guide layer 106 is silicon, an HF vapor etch before silicon etch will remove DSA template 402 and the crust of silicon oxide on placement guide layer 106. In the case where placement guide layer 106 is also oxide, a single HF vapor etch step will remove both DSA template 402 and placement guide layer 106 and remove neutral layer 202 along with the etch. One important factor for this placement guide layer removal step is that it should not displace the CNTs on the substrate and that is why vapor processes are preferred.

It is notable that a reverse charge version can be also implemented. For instance, according to another exemplary embodiment, a positive charge is present on the sidewall and top of the trenches (e.g., using $HfO_2$ or silicon nitride (SiN)), a negative charge is present on the bottom of the trench (e.g., using $SiO_2$), and a positive charge is present on the CNTs. This version is described in conjunction with the description of FIGS. 20-27, below.

Figure 12:
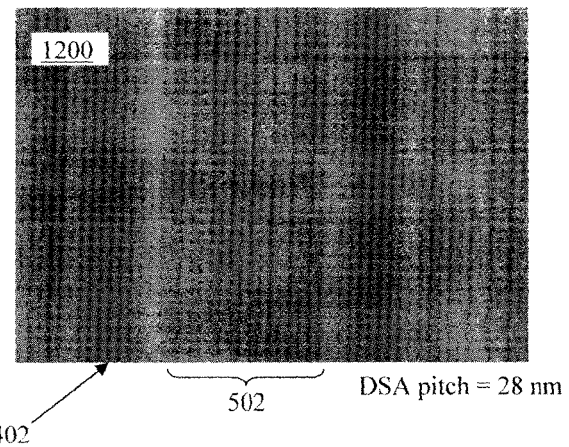
FIG. 12 is an image of a sample prepared according to the present techniques illustrating the DSA formation process according to an embodiment of the present invention.

With regard to the DSA formation step described in conjunction with the description of FIG. 5 above, FIG. 12 is an image 1200 of a sample prepared according to the present techniques. The example shown in FIG. 12 was prepared with a 28-nanometer (nm) DSA polymer. However, the present techniques extend to tighter DSA pitches in the same manner as described herein. It is notable that the space between the DSA templates 402 can be varied to control the number of trenches.

Figure 13:
FIG. 13 is an image of a sample prepared according to the present techniques illustrating use of the patterned DSA block copolymer to pattern the placement guide layer which shows how varying the space between the DSA templates can be used to vary the number of trenches formed according to an embodiment of the present invention.

With regard to the step of using the patterned DSA block copolymer 502 to pattern the placement guide layer 106 as described in conjunction with the description of FIG. 7 above, FIG. 13 is an image 1300 of a sample prepared according to the present techniques. FIG. 13 illustrates how, as provide above, varying the space between the DSA templates 402 can be used to vary the number of trenches formed.

Figure 14:
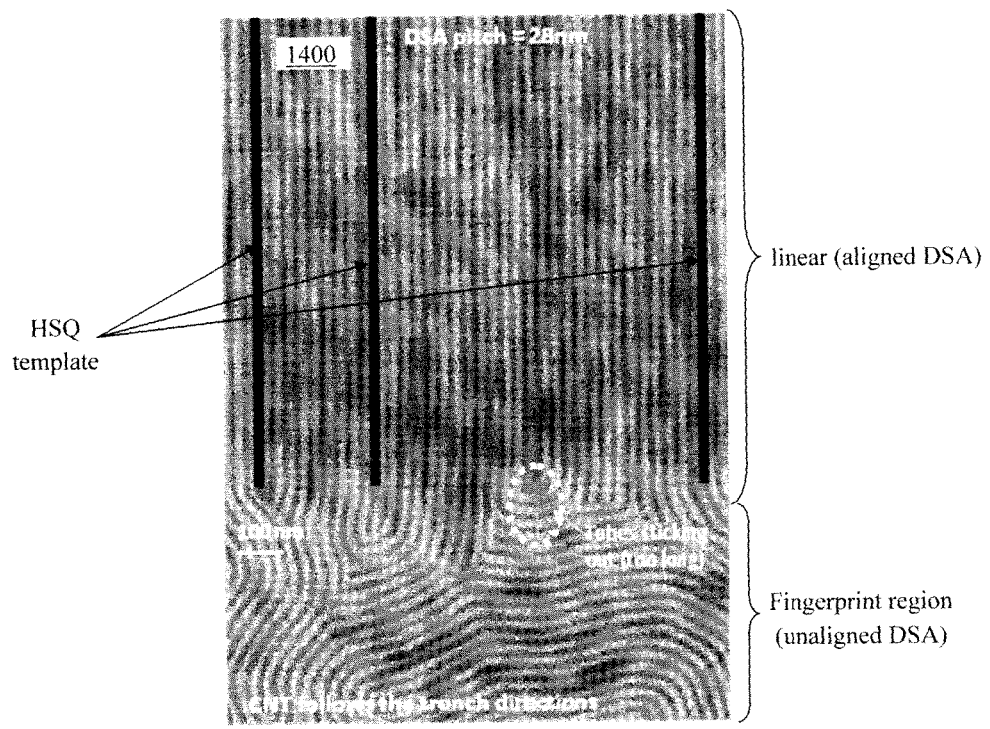
FIG. 14 is an image of a sample prepared according to the present techniques illustrating how good alignment of the carbon nanotubes along the trenches in the patterned poly-Si layer is achieved according to an embodiment of the present invention.
Figure 15:
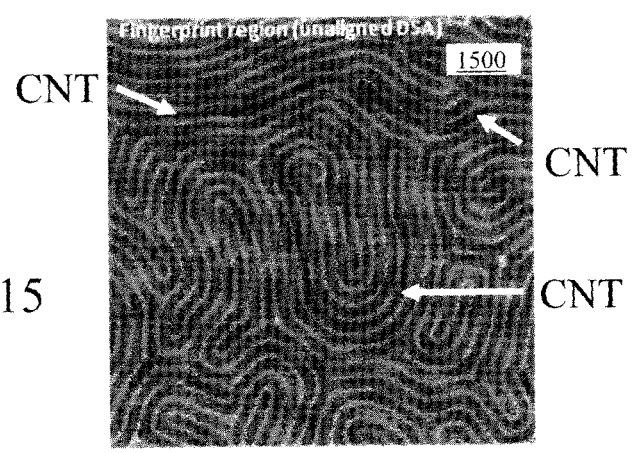
FIG. 15 is an image of a sample prepared according to the present techniques illustrating how due to the high placement selectivity of the present process, the carbon nanotubes will follow the DSA-produced trenches even when the trenches are unaligned according to an embodiment of the present invention.

With the present process, good alignment of the carbon nanotubes along the trenches in the patterned poly-Si layer is observed. See for example FIG. 14. FIG. 14 is an image 1400 of a sample prepared according to the present techniques. Darker contrast lines in image 1400 are aligned carbon nanotubes at the bottom of the poly-Si trenches which illustrates that the carbon nanotubes follow the trench direction (i.e., carbon nanotubes that are too long for the trench will still align in the trenches, with their excess length extending out from the trenches—see encircled region). FIG. 14 also shows how linear/parallel trenches are present in the region of the substrate where aligned DSA (based on the DSA template) was present, and fingerprint-like trench patterns are present in non-templated DSA regions. It is notable that, due to the high placement selectivity of the present process, the carbon nanotubes will follow the DSA-produced trenches even when the trenches are unaligned (i.e., in the fingerprint-like regions). See, for example, image 1500 shown in FIG. 15.

It has been found in accordance with the present techniques that once the poly-Si pattern is removed, the carbon nanotubes remain where placed, i.e., there is no movement of the carbon nanotubes due to the poly-Si barrier removal process. Thus, the carbon nanotubes placed in this manner will be spaced at the DSA pitch (which, by way of example only, is 28 nm in the above examples).

With carbon nanotubes placed at these sub-lithographic pitches, removal of the poly-Si barrier may be needed for further processing. For instance, according to an exemplary embodiment, the carbon nanotubes are used as the basis for forming one or more field effect transistor (FET) devices, wherein the carbon nanotubes form the channel regions of the devices. By way of example only, the fabrication of an exemplary carbon nanotube-based FET device is now described.

Figure 11:
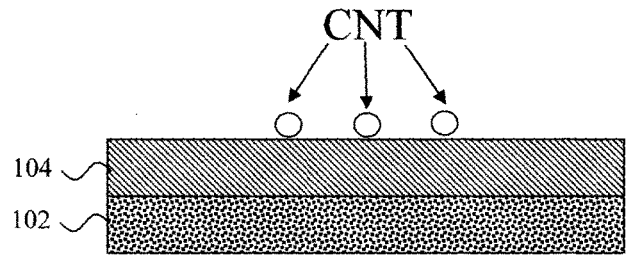
FIG. 11 is a cross-sectional diagram illustrating the placement guide layer having been removed, leaving the self-assembled carbon nanotubes on the surface of the dielectric according to an embodiment of the present invention.
Figure 16:
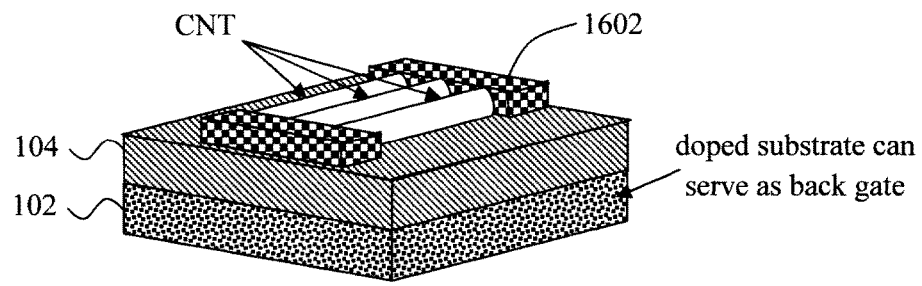
FIG. 16 is a cross-sectional diagram illustrating formation of metal source and drain contacts to the carbon nanotubes according to an embodiment of the present invention.

Switching to a three dimensional view, e.g., of the structure in FIG. 11, FIG. 16 illustrates the formation of metal source and drain contacts 1602 to the carbon nanotubes. In general, each of the carbon nanotube-based FETs formed will have a source and a drain interconnected by a carbon nanotube(s) channel, and a gate that regulates electron flow through the channel. Source and drain contacts 1602 can be formed from any suitable contact metal including, but not limited to, gold (Au), titanium (Ti), palladium (Pd), scandium (Sc), etc. using a standard deposition process such as evaporation, sputtering, etc. According to an exemplary embodiment, the FETs are back-gated devices. For example, substrate 102 can be doped (as known in the art) to serve as a back gate of the device. Alternatively, a gate (not shown) can be formed covering at least a portion of each of the carbon nanotubes. Suitable techniques for forming a gate over the carbon nanotubes is described for example in U.S. Pat. No. 7,795,677, entitled "Nanowire Field-Effect Transistors," issued to Bangsaruntip et al., the contents of which are incorporated by reference as if fully set forth herein.

Based on the above-described process, the carbon nanotubes will be present at a (sub-lithographic) pitch, e.g., of 28 nm, or less. Pitch is defined herein as the distance from a certain location on a given one of the carbon nanotubes to the same location on the carbon nanotube(s) that is/are immediately adjacent to the given carbon nanotube.

Figure 17:
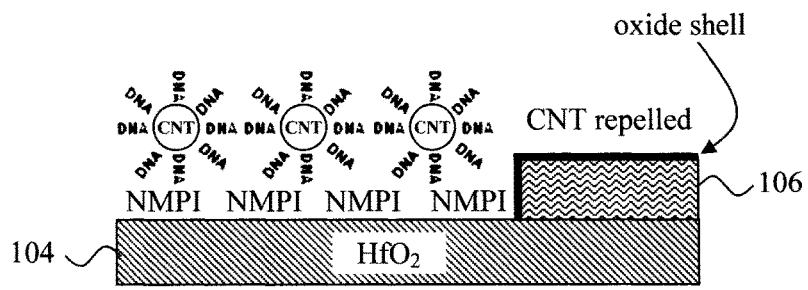
FIG. 17 is a diagram illustrating the carbon nanotubes functionalized with deoxyribonucleic acid (DNA) strands according to an embodiment of the present invention.

As provided above, several variants of the above-described DSA-based carbon nanotube placement process are anticipated herein. For example, SDS-solubilized carbon nanotubes are not the only way by which the carbon nanotubes can be functionalized for the present alignment process. Namely, the carbon nanotubes can also be functionalized with complementary DNA strands. See for example FIG. 17. The functionalization of single-walled carbon nanotubes with DNA strands is described generally, for example, in Tu et al., "DNA sequence motifs for structure-specific recognition and separation of carbon nanotubes" Nature vol. 460, pgs. 250-253 (9 Jul. 2009), the contents of which are incorporated by reference as if fully set forth herein. By functionalizing the carbon nanotubes in this manner, the carbon nanotubes will also have a negative surface charge. However, DNA functionalization provides a few notable benefits over the above-described SDS embodiment which ultimately serves to increase the placement yield. For instance, DNA solubilizes carbon nanotubes better than SDS, the resulting (i.e., aqueous) solution is more stable, and there is less bundling of the carbon nanotubes).

Further, the (negative) oxide shell on the placement guide layer 106 (see, for example, FIG. 9) can repel the carbon nanotubes from coming into the pattern trenches due to the Debye screening length. The Debye length measures the electrostatic effect of a charge carrier in a solution. The Debye length δ for a monovalent electrolyte can be calculated as follows:

$$\delta = \left(\frac{\varepsilon kT}{e^2 N_a 2C}\right)^{\frac{1}{2}}$$

wherein C is the concentration in moles per m³, T is temperature, permittivity $\varepsilon=\varepsilon_r\varepsilon_0$, and e is the electron charge. When trench width is scaled, the Debye screening length can thus prevent the negatively charged carbon nanotubes from entering the negative charge-lined trenches. A solution to this screening problem is to increase the salt concentration in the carbon nanotube solution (i.e., the electrolyte). For example, a minimum salt concentration (measured in millimoles mM) of 3 mM is needed to permit access of the carbon nanotubes to the trenches when the trench width is about 11 nm (as provided above the width of the trenches can be scaled based on the distance between the DSA templates). However, to ensure easy access to the trenches, more than the minimum salt concentration is desirable. According to an exemplary embodiment, a salt concentration of from about 1.0 to about 5.0 mM, and ranges therebetween, is desirable. However, SDS-solubilized carbon nanotubes are not very stable in these high salt solutions. DNA-solubilized carbon nanotubes, however, have advantageously been found to be stable in such high salt solutions. Thus, in scenarios where the Debye screening length presents a problem, these higher salt concentrations can be employed, and DNA-solubilized carbon nanotubes are preferable.

Figure 18:
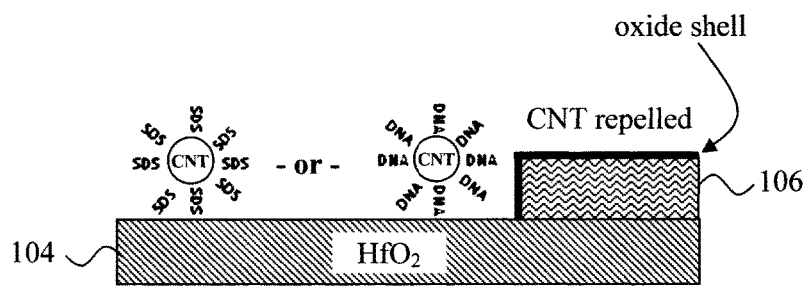
FIG. 18 is a diagram illustrating an alternative embodiment without NMPI monolayer functionalization which can be used in accordance with either SDS- or DNA-functionalized carbon nanotubes according to an embodiment of the present invention.

Also, as provided above, an NMPI monolayer can be used to functionalize the surface of the dielectric material 104—providing a positive surface charge. See, for example, FIG. 9. It is notable however that the dielectric materials 104 provided herein, such as HfO₂, are already positively charged in the aqueous conditions employed herein. Thus, NMPI functionalization is not a requirement, and embodiments are anticipated herein where the NMPI monolayer is not used. See, for example, FIG. 18 which shows an alternative embodiment without NMPI monolayer functionalization which can be used in accordance with either SDS- or DNA-functionalized carbon nanotubes.

Thus, generally provided herein are techniques for sub-lithographic patterning using DSA of a block copolymer and compatible processes to generate a surface pattern with differentiating charge characteristics, as well as compatible functionalization schemes on the carbon nanotubes and/or placement surfaces to afford selectivity (relying on the different isoelectric points between the placement surfaces and the carbon nanotubes. As provided in detail above, several variants are provided herein for how the carbon nanotubes are functionalized, how to get the carbon nanotubes in solution to the surface, and/or how the surface is functionalized. For clarity, a summary of the present techniques is provided in FIG. 19.

Figure 19:
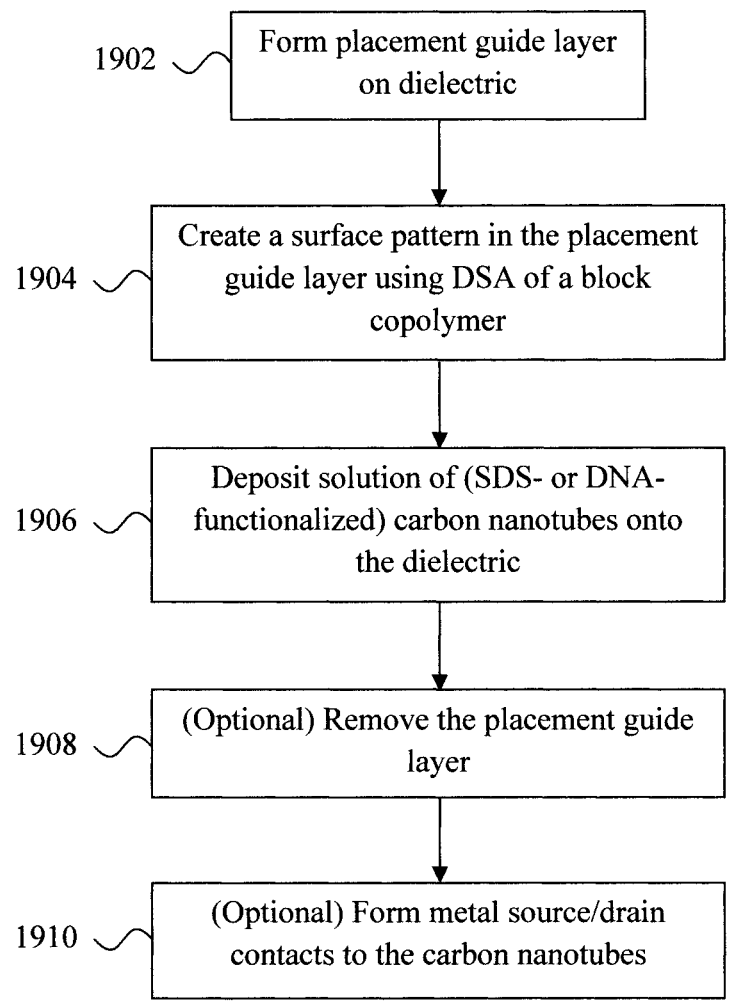
FIG. 19 is a diagram illustrating an exemplary methodology for placing carbon nanotubes on a dielectric according to an embodiment of the present invention.

Referring to FIG. 19, in step 1902 a (carbon nanotube) placement guide layer (e.g., poly-Si) is formed on the dielectric, and in step 1904 DSA of a block copolymer (e.g., PS-b-PMMA) is used to create a pattern in the placement guide layer. The processes of forming and patterning the DSA template (e.g., from an e-beam lithography resist material, a 193i resist material, or HSQ) and the DSA block copolymer, and transferring the DSA pattern to the placement guide layer were described in detail above.

Based on the above-described process, the pattern will consist of one or more trenches formed in the carbon nanotube placement guide layer. The formation of an oxide shell on the patterned placement guide layer will provide a first (i.e., negative) charge on the sidewall and top surfaces of the trenches. Due to the presence of the dielectric at the bottom of the trenches (see, e.g., FIG. 9, FIG. 17, and FIG. 18) a different charge will be present on the bottom surfaces of the trenches. Namely, the bottom of the trenches will have a second (i.e., positive) surface charge. The dielectric materials contemplated herein, such as $HfO_2$, already have a positive charge (and thus, the carbon nanotubes will be placed directly on the dielectric). However, as provided above, a surface monolayer of NMPI can optionally be formed on the dielectric to functionalize the dielectric— giving the dielectric a positive surface charge. In that case, the carbon nanotubes will be placed on the surface monolayer of the NMPI.

In step 1906, a carbon nanotube solution is deposited onto the dielectric. As provided above, the solution preferably contains only semiconducting single-walled carbon nanotubes. SDS or DNA is used to solubilized/functionalize the carbon nanotubes, giving the carbon nanotubes a negative surface charge. As provided above, DNA-functionalized carbon nanotubes are more stable in high salt concentration solutions, which can be beneficial in scenarios where the Debye screening length presents a problem (e.g., due to smaller trench width).

Self-assembly of the deposited carbon nanotubes within the trenches will occur based on i) attractive forces between the first (i.e., negative) charge on the surfaces of the carbon nanotubes and the second (i.e., positive) charge on the bottom surfaces of the trenches and ii) repulsive forces between the first (i.e., negative) charge on the surfaces of the carbon nanotubes and the first (i.e., negative) charge on sidewall and top surfaces of the trenches.

The deposited/self-assembled carbon nanotubes can then be used for a variety of different applications. For example, a carbon nanotube-based FET can be formed. By way of example only, in step 1908 the placement guide layer is removed, and in step 1910 metal source and drain contacts are formed to the carbon nanotubes.

As provided above, a reverse charge version of the present placement structure can be implemented. This alternative embodiment is now described by way of reference to FIGS. 20-27. The same general process flow is being implemented as provided in FIGS. 1-11 above. The materials and their functionality, however, differ in some aspects.

Figure 20:
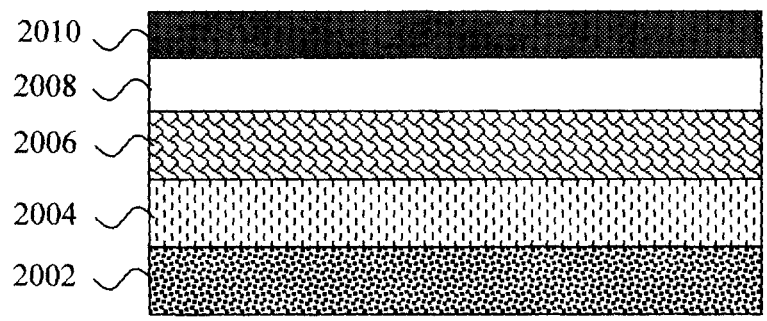
FIG. 20 is a cross-sectional diagram illustrating, according to an alternative embodiment for creating a reverse charge version of the placement structure, a dielectric material having been deposited onto a substrate, a (carbon nanotube) placement guide layer having been deposited onto the dielectric material, a neutral layer having been formed on the placement guide layer, and a DSA template resist material having been deposited on the neutral layer according to an embodiment of the present invention.
Figure 21:
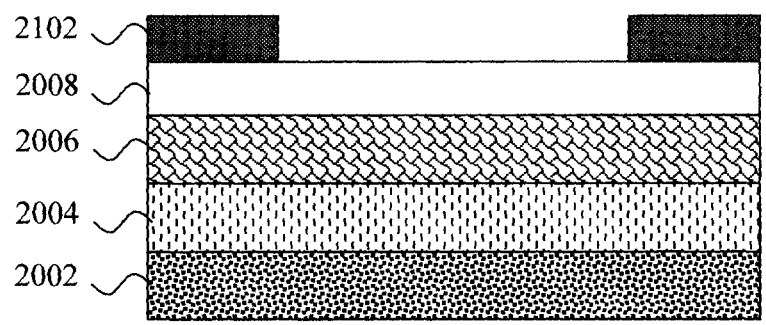
FIG. 21 is a cross-sectional diagram illustrating the DSA template resist material having been patterned to form a DSA template according to an embodiment of the present invention.

For example, as shown in FIG. 20, the process begins with the deposition of a dielectric material 2004 on a substrate 2002. Suitable substrate materials were provided above. However, in this example the dielectric material 2004 is silicon oxide ($SiO_2$). Suitable deposition processes (e.g., CVD), layer thicknesses (e.g., from about 2 nm to about 50 nm, and ranges therebetween), etc. were provided above. Alternative, the dielectric material 2004 can consist of an oxide shell on an Si layer (not shown), which happens automatically in air or aqueous solution.

A (carbon nanotube) placement guide layer 2006 is blanket deposited onto the dielectric material 2004. In this example, the placement guide layer 2006 is formed from an oxide material such as $HfO_2$ or $AlO_2$, or silicon nitride (SiN). Suitable deposition processes (e.g., CVD), layer thicknesses (e.g., from about 1 nm to about 10 nm, and ranges therebetween), etc. were provided above. A neutral layer 2008 is formed on the placement guide layer 2006. The use of a neutral layer was described in detail above.

To form the DSA template, a DSA template resist material 2010 is deposited on the neutral layer 2008. Suitable DSA template resist materials were provided above. The DSA template resist material is then patterned (see above) to form a DSA template 2102 on the neutral layer 2008. See FIG. 21. The DSA template serves to align the assembly of the DSA block copolymer into linear segments. Thus when the DSA block copolymer is used to pattern trenches in the underlying substrate and carbon nanotubes are deposited in the trenches, the carbon nanotubes will be linear/parallel to one another on the surface of the substrate.

Figure 22:
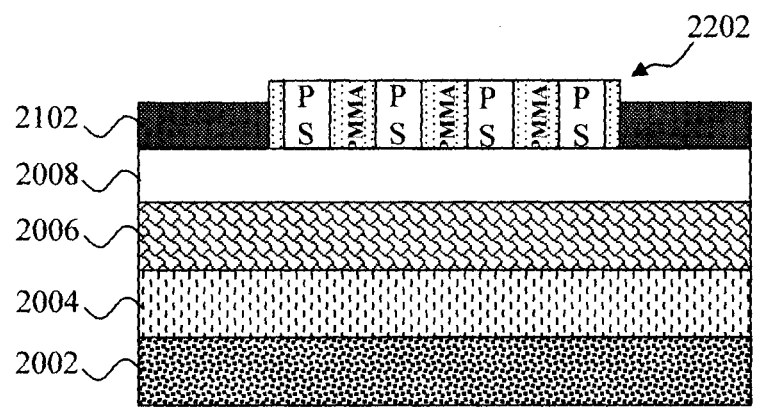
FIG. 22 is a cross-sectional diagram illustrating a DSA block copolymer having been deposited onto the neutral layer and the DSA template according to an embodiment of the present invention.

Next, as shown in FIG. 22, a suitable DSA block copolymer 2202 such as PS-b-PMMA is deposited onto the neutral layer 2008 within the DSA template 2102. The self-assembly of the block copolymer is facilitated by a thermal treatment, suitable conditions for which were provided above. The DSA template 2102 provides a guide for self-assembly of the block copolymer.

Figure 23:
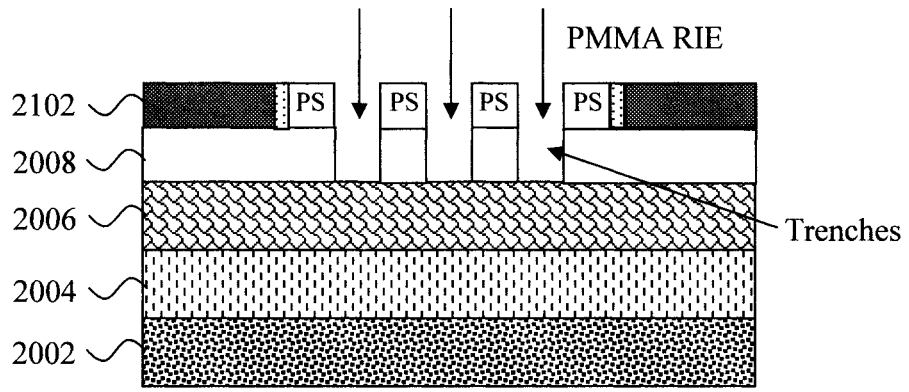
FIG. 23 is a cross-sectional diagram illustrating the DSA block copolymer having been patterned according to an embodiment of the present invention.

A selective etching process can then be used to pattern the DSA block copolymer 2202. For example, as shown in FIG. 23, with a PS-b-PMMA block copolymer 2202, a PMMA RIE can be used to remove the PMMA blocks from the copolymer 2202, forming trenches in the copolymer 2202. From FIG. 23 it can be seen that such a PMMA selective RIE will also etch the underlying neutral layer 2008.

Figure 24:
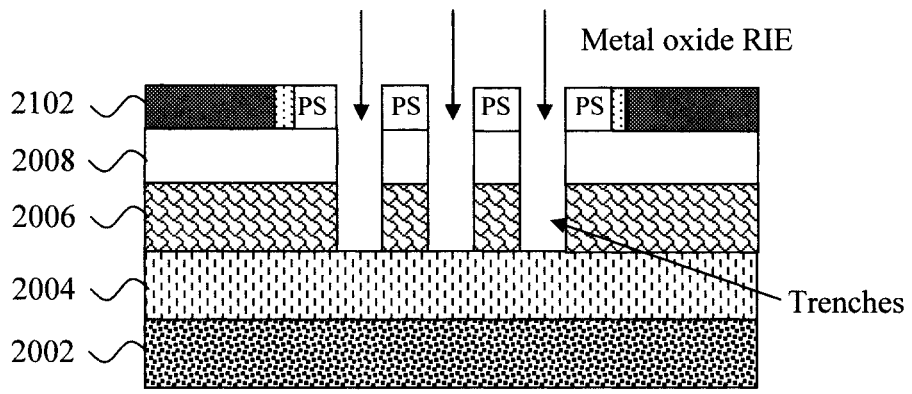
FIG. 24 is a cross-sectional diagram illustrating the pattern from the DSA block copolymer having been transferred to the placement guide layer according to an embodiment of the present invention.
Figure 25:
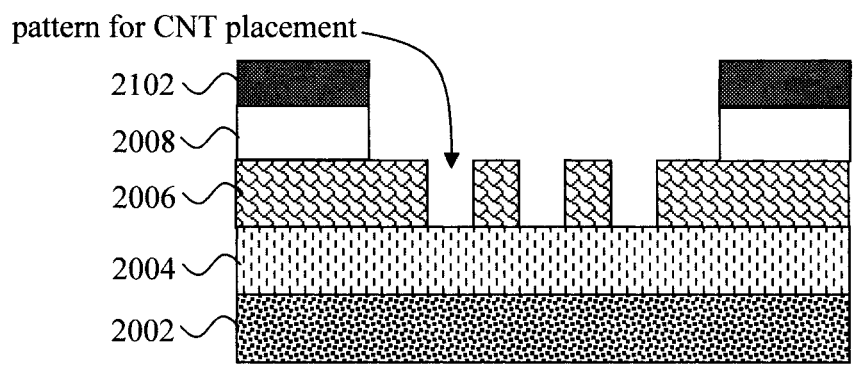
FIG. 25 is a cross-sectional diagram illustrating the remaining PS blocks and the neutral layer below having been removed according to an embodiment of the present invention.

The pattern from the DSA block copolymer 2202 can then be transferred to the placement guide layer 2006 using, e.g., a metal oxide-selective or nitride-selective RIE. See FIG. 24. As shown in FIG. 24, the patterned placement guide layer 2006 now contains a plurality of trenches. An $O_2$ plasma etch can then be used to remove the remaining PS blocks. See FIG. 25. As shown in FIG. 25, an $O_2$ plasma etch will also remove all but those portions of the neutral layer 2008 covered by the DSA template 2102.

In this example, a positive charge is present on the sidewall and top of the trenches, a negative charge is present on the bottom of the trench, and a positive charge is created on the CNTs. Suitable techniques for creating a positive surface charge on the carbon nanotubes using, e.g., poly (diallyldimethylammonium chloride (PDDA), is described in Kowalewska et al., "Application of Positively Charged Carbon Nanotubes to Layer-by-Layer Assemblies of Dehydrogenase Enzymes for Molecular Bioelectronic Devices," Abstract #2440, $224^{th}$ ECS Meeting (October/November 2013), the contents of which are incorporated by reference as if fully set forth herein.

Figure 26:
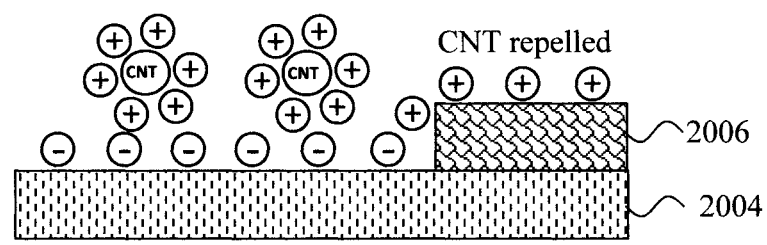
FIG. 26 is a cross-sectional diagram illustrating how the positive surface charge attracts the carbon nanotubes to the negatively charged surface of the dielectric, and repels the carbon nanotubes from the positively charged placement guide layer according to an embodiment of the present invention.

The surface functionalization chemistry in this example is shown illustrated in FIG. 26. As shown in FIG. 26, the positive surface charge of the (functionalized) CNTs attracts the carbon nanotubes to the negatively charged surface of the dielectric 2004; and repels the carbon nanotubes from the positively charged placement guide layer 2006. The configuration shown in FIG. 9, however, is merely an example.

Figure 27:
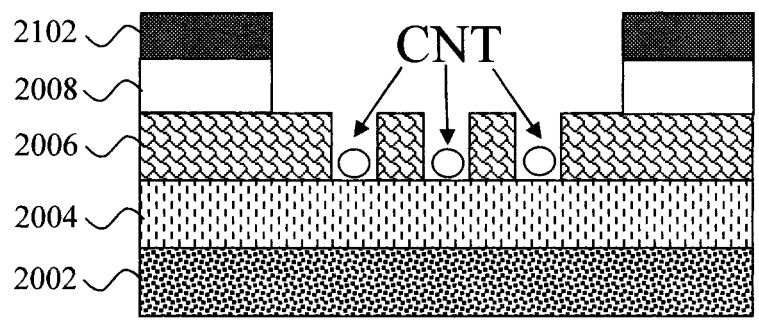
FIG. 27 is a cross-sectional diagram illustrating carbon nanotubes having been deposited onto the structure according to an embodiment of the present invention.

Next, as shown in FIG. 27, CNTs are deposited onto the structure. Based on the above-described charge arrangement between the carbon nanotubes, the dielectric 2004, and the placement guide layer 2006, the carbon nanotubes are repelled by the placement guide layer 2006 and attracted to the dielectric 2004. As shown in FIG. 27, as a result, the carbon nanotubes self-arrange within the patterned placement guide layer 2006. Thus, the patterned placement guide layer 2006 acts as a barrier for the carbon nanotube placement.

As described above, following placement of the carbon nanotubes, the placement guide layer 2006 can be removed, leaving the self-assembled carbon nanotubes on the surface of the dielectric 2004. This step was described in detail in conjunction with the description of FIG. 11, above.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A carbon nanotube-based field effect transistor (FET) device, comprising:
   a semiconductor substrate;
   a dielectric disposed directly on the semiconductor substrate;
   carbon nanotubes placed side by side and parallel to one another on the dielectric, wherein a pitch of the carbon nanotubes is less than or equal to about 28 nanometers, wherein the carbon nanotubes are functionalized to have a first charge on surfaces thereof, and wherein the dielectric is functionalized to have a second charge; and
   metal source and drain contacts on the carbon nanotubes, wherein the metal source and drain contacts include a first metal contact and a second metal contact that are in direct contact with opposite ends of each of the carbon nanotubes,
   wherein the carbon nanotube-based FET further comprises:
   a surface monolayer of 4-(N-hydroxycarboxamido)-1-methylpyridinium iodide (NMPI) on the dielectric which functionalizes the dielectric with the second charge, wherein the carbon nanotubes are placed on the surface monolayer of the NMPI.

2. The carbon nanotube-based FET of claim 1, wherein the semiconductor substrate comprises a material selected from the group consisting of: silicon (Si), germanium (Ge) and silicon germanium (SiGe).

3. The carbon nanotube-based FET of claim 1, wherein the dielectric comprises an oxide material selected from the group consisting of: hafnium oxide ($HfO_2$) and aluminum oxide ($AlO_2$).

4. The carbon nanotube-based FET of claim 1, wherein the metal source and drain contacts are formed from a contact metal selected from the group consisting of: gold (Au) and scandium (Sc).

5. The carbon nanotube-based FET of claim 1, wherein the semiconductor substrate is doped and serves as a back gate of the carbon nanotube-based FET device.

6. The carbon nanotube-based FET of claim 1, wherein the first charge is a negative charge, and wherein the second charge is a positive charge.

7. The carbon nanotube-based FET of claim 1, wherein the carbon nanotubes are functionalized with sodium dodecyl sulphate (SDS).

* * * * *